(12) United States Patent
Wang et al.

(10) Patent No.: US 7,952,935 B2
(45) Date of Patent: May 31, 2011

(54) NONVOLATILE MEMORY DEVICE AND PROGRAM OR VERIFICATION METHOD USING THE SAME

(75) Inventors: In Soo Wang, Chungcheongbuk-do (KR); Yu Jong Noh, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 178 days.

(21) Appl. No.: 12/472,442

(22) Filed: May 27, 2009

(65) Prior Publication Data
US 2010/0182840 A1    Jul. 22, 2010

(30) Foreign Application Priority Data

Jan. 21, 2009  (KR) .............................. 2009-0005070

(51) Int. Cl.
*G11C 16/06* (2006.01)
(52) U.S. Cl. .......... 365/185.21; 365/185.19; 365/185.25
(58) Field of Classification Search ............. 365/185.21, 365/185.19, 185.25
See application file for complete search history.

(56) References Cited

U.S. PATENT DOCUMENTS
7,239,554 B2 *  7/2007  Jeong ....................... 365/185.21

FOREIGN PATENT DOCUMENTS
| KR | 101997010283 | 6/1997 |
| KR | 1019990081305 | 11/1999 |
| KR | 1020080084026 | 9/2008 |

OTHER PUBLICATIONS

Taehee Cho et al., "A Dual-Mode NAND Flash Memory: 1-Gb Multilevel and High-Performance 512-Mb Single-Level Modes,". IEEE Journal of Solid State Circuits, Nov. 2001, pp. 1700-1706, vol. 36, No. 11, IEEE.

* cited by examiner

*Primary Examiner* — Huan Hoang
(74) *Attorney, Agent, or Firm* — IP & T Group LLP

(57) ABSTRACT

A nonvolatile memory device includes a bit line sensing signal supply unit configured to output a bit line sensing signal, having a rising voltage level that rises in discrete steps, in response to a control signal, and a bit line sensing unit configured to selectively connect a bit line and a sensing node in response to the bit line sensing signal.

16 Claims, 7 Drawing Sheets

NONVOLATILE MEMORY DEVICE AND PROGRAM OR VERIFICATION METHOD USING THE SAME

CROSS-REFERENCES TO RELATED APPLICATIONS

Priority to Korean patent application number 10-2009-0005070 filed on Jan. 21, 2009, the entire disclosure of which is incorporated by reference herein, is claimed.

BACKGROUND

One or more embodiments relate to a nonvolatile memory device with an improved structure and a program or verification method using the same.

Recently, there is an increasing demand for nonvolatile memory devices which can be electrically programmed and erased and do not require the refresh function of rewriting data at specific periods.

A nonvolatile memory cell enables electrical program/erase operations and performs the program and erase operations through a threshold voltage that varies when electrons are migrated by a strong electric field applied to a thin oxide layer.

The nonvolatile memory device typically includes a memory cell array in which cells for storing data are arranged in a matrix form and a page buffer for writing data into specific cells of the memory cell array or reading data stored in specific cells thereof. The page buffer includes a bit line select unit configured to selectively connect any one of an even bit line and an odd bit line to a sensing node, a sensing node precharge unit configured to apply a power supply voltage of a high level to the sensing node, a data latch unit configured to temporarily store data to be programmed into cells or to temporarily store data read from cells, a data setting unit configured to input data to be stored in the data latch unit, a sensing node sensing unit configured to apply a ground voltage to a specific node of the data latch unit depending on the level of the sensing node, a data transfer unit configured to apply data, stored in the data latch unit, to the sensing node, and a bit line sensing unit configured to selectively connect the sensing node and a bit line selected by the bit line select unit.

The nonvolatile memory device is becoming highly integrated as a technology develops. There has been a trend where the critical dimension (CD) between bit lines connected to respective memory cell strings has been decreasing. Accordingly, more current may be consumed when the bit lines of a nonvolatile memory device using a boosting scheme are discharged because of increased parasitic capacitance between the bit lines.

In particular, in the bit line sensing unit configured to connect the sensing node and the bit line through a bit line sensing signal, the voltage level of the bit line sensing signal may abruptly change from a low level to a high level, so a current value flowing through the bit line suddenly increases. Accordingly, it may be desirable to minimize the occurrence of the peak current resulting from the bit line sensing signal.

BRIEF SUMMARY

One or more embodiments are directed towards a nonvolatile memory device for supplying a bit line sensing signal whose voltage level is not rapidly changed. Furthermore, one or more embodiments are directed towards a program and verification method using the nonvolatile memory device.

One or more embodiments are directed to a nonvolatile memory device includes a bit line sensing signal supply unit configured to output a bit line sensing signal, having a rising voltage level that rises in discrete steps, in response to a control signal, and a bit line sensing unit configured to selectively connect a bit line and a sensing node in response to the bit line sensing signal.

One or more embodiments are directed to a program method using a nonvolatile memory device, including precharging a sensing node to a high level, precharging bit lines to a high level, and connecting the sensing node and one of the bit lines by applying a bit line sensing signal, having a rising voltage level that rises in discrete steps, to a switching element configured to selectively connect the sensing node and the bit line.

One or more embodiments are directed to a read method using a nonvolatile memory device, including precharging a sensing node to a high level, connecting a bit line and the sensing node by applying a bit line sensing signal of a first voltage to a switching element configured to selectively connect the sensing node and the bit line, wherein a voltage level of the bit line sensing signal rises in discrete steps and reaches the first voltage, stopping the application of the bit line sensing signal and changing a voltage level of the bit line depending on a state of cells to be verified, and applying the bit line sensing signal of a second voltage so that a voltage state of the bit line is transferred to the sensing node.

DESCRIPTION OF SPECIFIC EMBODIMENT

Hereinafter, the present disclosure will be described in detail in connection with one or more embodiments with reference to the accompanying drawings. The figures are provided to allow those having ordinary skill in the art to understand the scope of one or more embodiments of the disclosure.

Figure 1:
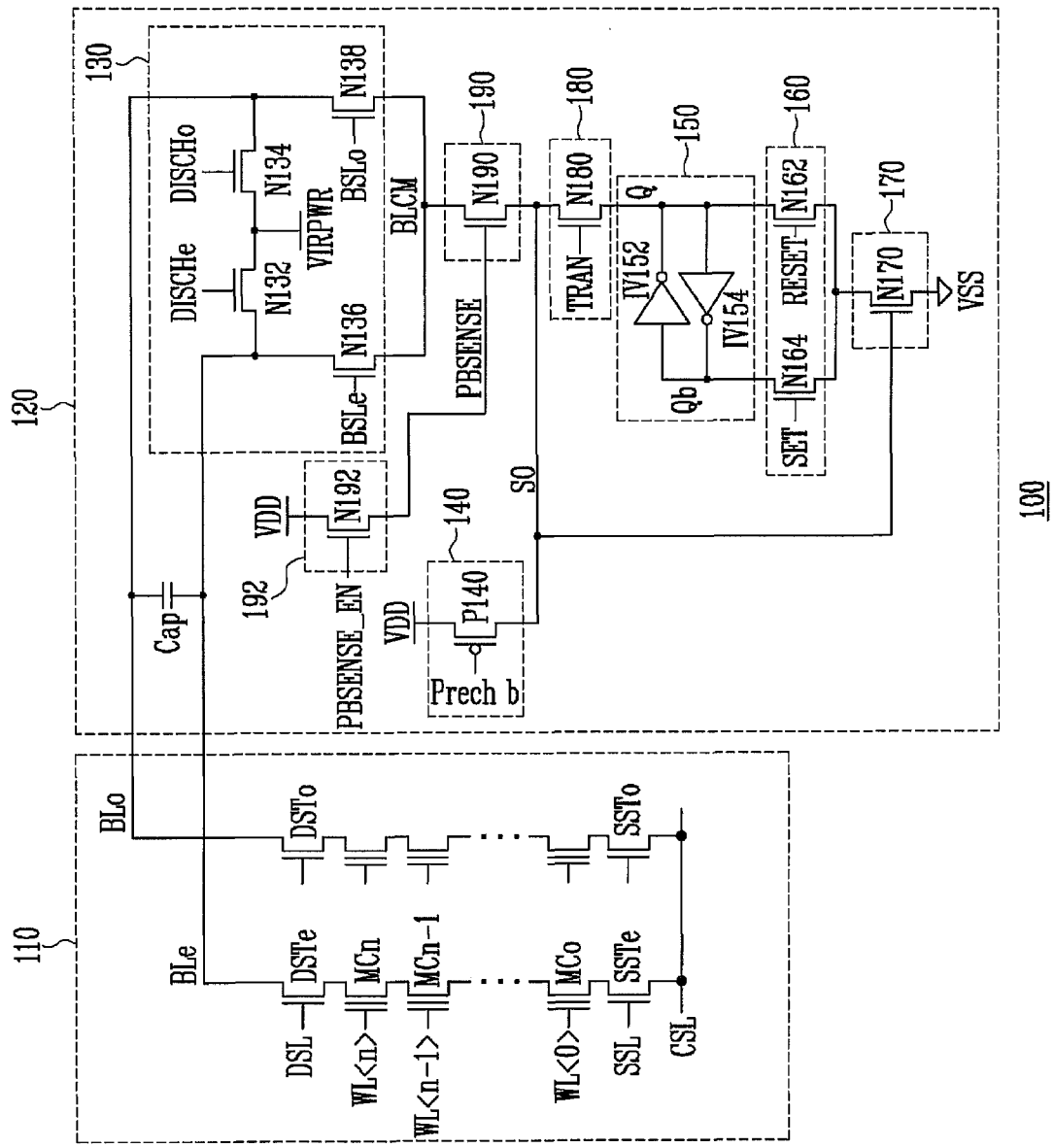
FIG. 1 is a circuit diagram showing the construction of a known nonvolatile memory device.

FIG. 1 is a circuit diagram showing the construction of a known nonvolatile memory device.

The nonvolatile memory device 100 includes a memory cell array 110, including a number of memory cells, and a page buffer 120 connected to the memory cells and configured to program specific data into the memory cells or to read data stored in the memory cells.

The memory cell array 110 includes memory cells MC0 to MCn configured to store data, word lines WL<0:n> configured to select and enable the memory cells, and bit lines BLe and BLo configured to input or output data to or from the memory cells. The word lines and the bit lines are arranged in a matrix form.

The memory cell array 110 further includes drain select transistors DSTe and DSTo, connected between the bit lines and the memory cells, and source select transistors SSTe and SSTo, connected between a common source line CSL and the memory cell. The memory cells MC0 to MCn, connected in series between the source select transistor SSTe or SSTo and the drain select transistor DSTe or DSTo, is called a cell string. The drain select transistor DSTe or DSTo selectively connects the memory cell string and the bit line BLe or BLo in response to a drain select signal DSL. The source select transistor SSTe or SSTo selectively connects the memory cell string and the common source line CSL in response to a source select signal SSL.

The gates of the memory cells are connected to the respective word lines. A set of the memory cells commonly connected to the same word line is called a page. The memory cell strings connected to the respective bit lines are commonly connected in parallel to the common source line CSL, thereby forming a memory cell block.

The page buffer 120 includes a bit line select unit 130, a sensing node precharge unit 140, a data latch unit 150, a data setting unit 160, a sensing node sensing unit 170, a data transfer unit 180, and a bit line sensing unit 190. The bit line select unit 130 selectively connects any one of the even bit line and the odd bit line to a sensing node SO. The sensing node precharge unit 140 applies power supply voltage of a high level to the sensing node SO. The data latch unit 150 temporarily stores data to be programmed into cells or temporarily stores data read from cells. The data setting unit 160 inputs data to be stored in the data latch unit 150. The sensing node sensing unit 170 applies a ground voltage to a specific node of the data latch unit 150 depending on the level of the sensing node SO. The data transfer unit 180 applies data, stored in the data latch unit, to the sensing node. The bit line sensing unit 190 selectively connects sensing node and a bit line selected by the bit line select unit 130.

The bit line select unit 130 includes an NMOS transistor N136 configured to connect the even bit line BLe and the sensing node SO in response to a first bit line select signal BSLe and an NMOS transistor N138 configured to connect the odd bit line BLo and the sensing node SO in response to a second bit line select signal BSLo. The bit line select unit 130 further includes a variable voltage input terminal configured to apply a variable voltage VIRPWR of a specific level, an NMOS transistor N132 configured to connect the even bit line BLe and the variable voltage input terminal in response to a first discharge signal DISCHe, and an NMOS transistor N134 configured to connect the odd bit line BLo and the variable voltage input terminal in response to a second discharge signal DISCHo.

The sensing node precharge unit 140 applies a high-level voltage VDD to the sensing node SO in response to a precharge signal Prech b. To this end, the sensing node precharge unit 140 includes a PMOS transistor P140 connected between a power supply voltage terminal VDD and the sensing node SO. Accordingly, the power supply voltage of a high level is applied to the sensing node SO in response to the precharge signal Prech b of a low level.

The data latch unit 150 temporarily stores data to be programmed into the memory cells or temporarily stores data read from the memory cells. To this end, the data latch unit 150 includes a first inverter IV152 and a second inverter IV154. The output terminal of the first inverter IV152 is connected to the input terminal of the second inverter IV154, and the output terminal of the second inverter IV154 is connected to the input terminal of the first inverter IV152. Here, a node between the output terminal of the first inverter IV152 and the input terminal of the second inverter IV154 is called a first node Q, and a node between the output terminal of the second inverter IV154 and the input terminal of the first inverter IV152 is called a second node Qb.

The data setting unit 160 includes a first data setting transistor N162 configured to apply a ground voltage to the first node Q of the data latch unit 150 and a second data setting transistor N164 configured to apply a ground voltage to the second node Qb of the data latch unit 150. The first data setting transistor N162 is connected between the sensing node sensing unit 170 and the first node Q and is configured to apply a ground voltage, transferred by the sensing node sensing unit 170, to the first node Q in response to a first data setting signal RESET. The second data setting transistor N164 is connected between the sensing node sensing unit 170 and the second node Qb and is configured to apply the ground voltage, transferred by the sensing node sensing unit 170, to the second node Qb in response to a second data setting signal SET.

The sensing node sensing unit 170 applies the ground voltage to the data setting unit 160 depending on the voltage level of the sensing node SO. The sensing node sensing unit 170 includes an NMOS transistor N170 connected between the data setting unit 160 and the ground terminal VSS. Accordingly, the ground voltage is applied to the data setting unit 160 depending on the voltage level of the sensing node SO. When the voltage level of the sensing node SO is in a high level, the NMOS transistor N170 applies the ground voltage to the data setting unit 160. Here, if the first data setting signal RESET of a high level is applied to the first data setting transistor N162, the ground voltage is applied to the first node Q. In this case, it is considered that low-level data has been applied to the first node Q. However, if the second data setting signal SET of a high level is applied to the second data setting transistor N164, the ground voltage is applied to the second node Qb. In this case, it is considered high-level data has been applied to the first node Q.

The data transfer unit 180 selectively applies data, stored in the first node Q of the data latch unit 150, to the sensing node SO. The data transfer unit 180 includes a data transfer transistor N180 configured to selectively connect the first node Q and the sensing node SO in response to a data transfer signal TRAN.

The bit line sensing unit 190 includes an NMOS transistor N190 connected between the bit line select unit 130 and the sensing node SO. The bit line sensing unit 190 is configured to connect a bit line common node BLCM and the sensing node SO in response to a bit line sensing signal PBSENSE of a high level and to evaluate the voltage level of a specific bit line so that the voltage level of data stored in a memory cell is applied to the sensing node SO. Here, a first voltage V1 or a second voltage V2 lower than the first voltage may be used as the voltage of the bit line sensing signal PBSENSE. That is, a read or verification operation is performed depending on the voltage level of the bit line sensing signal PBSENSE applied to the gate of the NMOS transistor N190.

The nonvolatile memory device 100 further includes a bit line sensing signal supply unit 192 configured to output the bit line sensing signal PBSENSE applied to the bit line sensing unit 190. The bit line sensing signal supply unit 192 has a gate to which a bit line sensing enable signal PBSENSE_EN is input and includes an NMOS transistor N192 configured to supply a power supply voltage VDD to the bit line sensing unit 190. Accordingly, if the bit line sensing enable signal PBSENSE_EN of a high level is applied, high-level voltage is applied through the bit line sensing signal supply unit 192.

Figure 2:
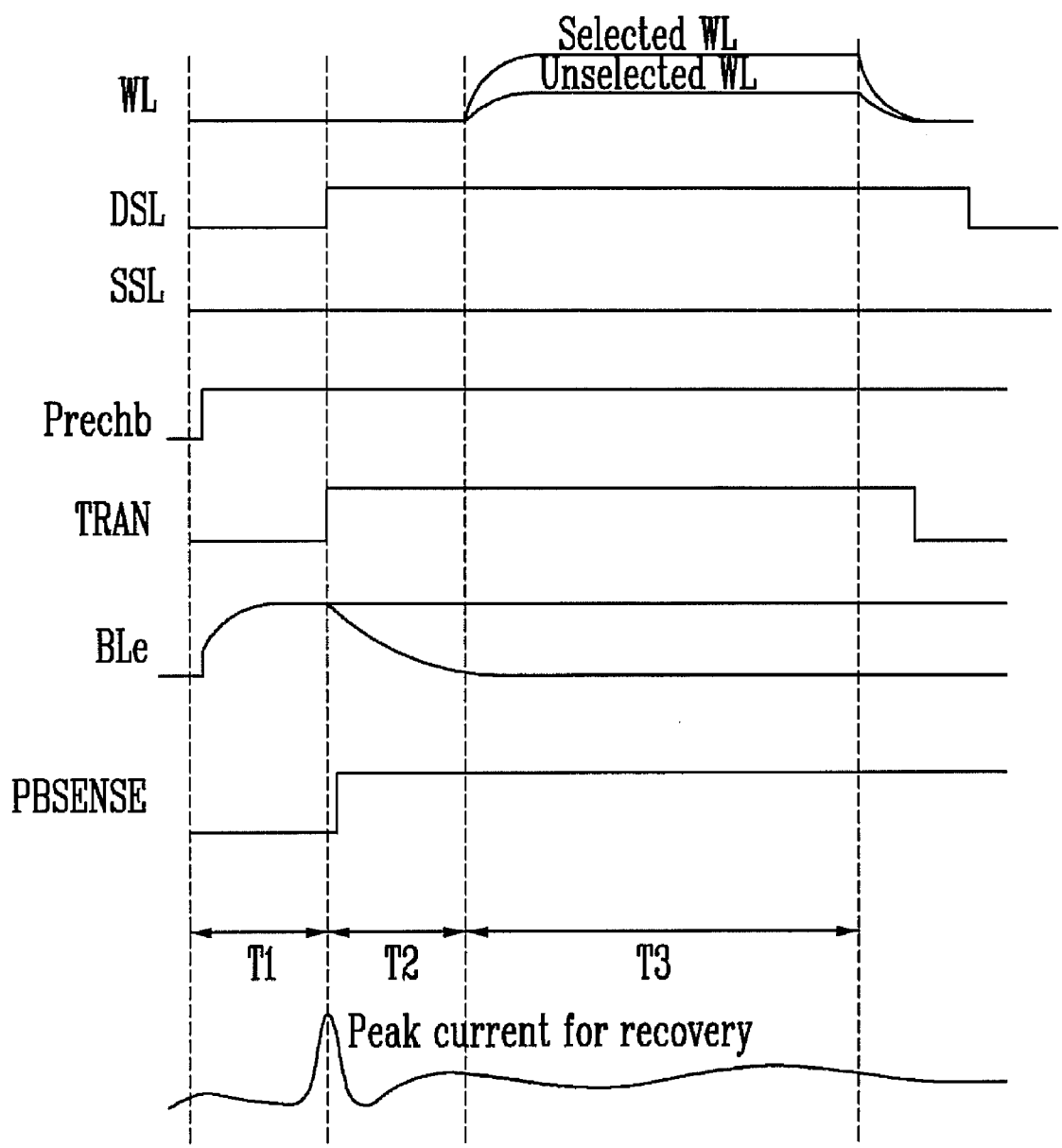
FIG. 2 is a waveform showing various signals applied when a program operation using the known nonvolatile memory device is performed.

FIG. 2 is a waveform showing various signals applied when a program operation using the known nonvolatile memory device is performed.

(1) Period T1

First, in the state where the connection between the sensing node and the bit line is disconnected, the sensing node is floated and the bit line is precharged to a high level.

(2) Period T2

The data transfer signal TRAN is applied so that data stored in the first node Q is applied to the sensing node SO. Here, in the case where cells are programmed using a known method, data [0] is stored and, in the case where cells are erased using a known method, data [1] is stored.

The bit line sensing signal PBSENSE is then applied so that the data applied to the sensing node SO is transferred to the bit line. Accordingly, in the case of cells to be erased, the voltage level of the bit line BLe remains in a high level. However, in the case of cells to be programmed, the voltage level of the bit line BLe shifts to a low level because of data [0].

Meanwhile, the voltage level of the bit line sensing signal PBSENSE rapidly changes from a low level to a high level. Accordingly, a current value flowing through the bit line rapidly rises as shown in FIG. 2.

(3) Period T3

A program operation is then performed by applying a program voltage to a word line including cells to be programmed and a pass voltage to the remaining word lines. Accordingly, the threshold voltages of the cells to be programmed may rise because of FN tunneling. Although not shown in the drawing, a verification operation is performed in order to check whether the threshold voltages of the cells to be programmed rise higher than a desired voltage.

One or more embodiments are directed to minimizing the occurrence of a peak current resulting from the bit line sensing signal in this program operation. As the critical dimension between bit lines gradually decreases, parasitic capacitance between the bit lines may increase. Thus, it is desirable to reduce the occurrence of the peak current.

Figure 3:
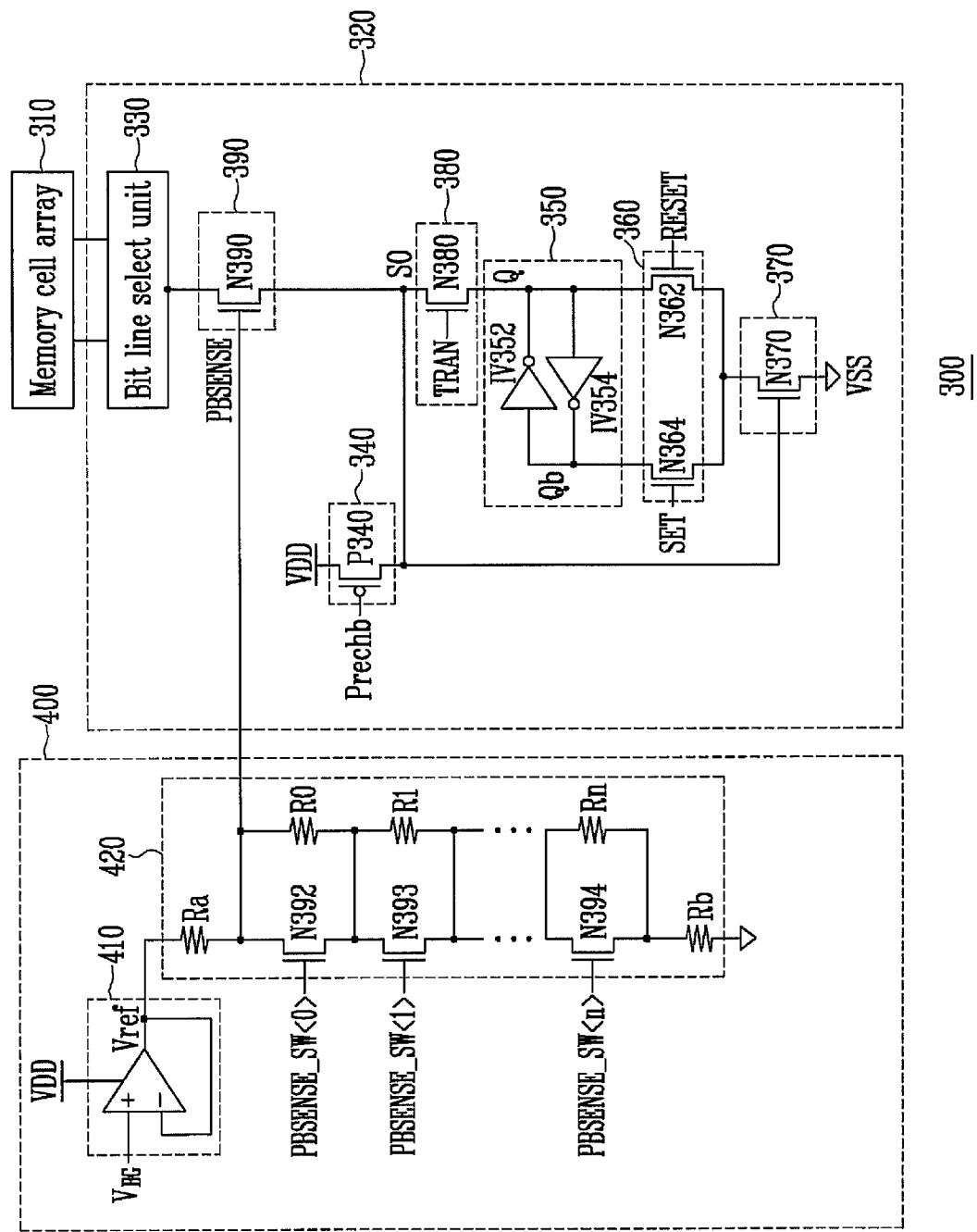
FIG. 3 is a circuit diagram showing the construction of a nonvolatile memory device including a bit line sensing signal generation unit according to an embodiment.

FIG. 3 is a circuit diagram showing the construction of a nonvolatile memory device including a bit line sensing signal generation unit according to an embodiment.

The nonvolatile memory device 300 includes a memory cell array 310 including a number of memory cells and a page buffer 320 connected to the memory cells and configured to program specific data and to read data stored in the memory cells.

The page buffer 320 includes a bit line select unit 330, a sensing node precharge unit 340, a data latch unit 350, a data setting unit 360, a sensing node sensing unit 370, a data transfer unit 380, and a bit line sensing unit 390. The bit line select unit 330 selectively connects any one of an even bit line and an odd bit line to a sensing node SO. The sensing node precharge unit 340 applies a power supply voltage of a high level to the sensing node SO. The data latch unit 350 temporarily stores data to be programmed into the memory cells or temporarily stores data read from the memory cells. The data setting unit 360 inputs data to be stored in the data latch unit 350. The sensing node sensing unit 370 applies a ground voltage to a specific node of the data latch unit 350 depending on the level of the sensing node SO. The data transfer unit 380 applies data, stored in the data latch unit 350, to the sensing node SO. The bit line sensing unit 390 selectively connects the sensing node SO and a bit line selected by the bit line select unit 330.

The nonvolatile memory device 300 further includes a bit line sensing signal supply unit 400 configured to output a bit line sensing signal PBSENSE applied to the bit line sensing unit 390.

To the extent that some of the features of the nonvolatile memory device 300 may be similar to that of the nonvolatile memory device shown in FIG. 1, redundant description thereof is omitted as being duplicative.

The bit line sensing signal supply unit 400 is described in detail.

The bit line sensing signal supply unit 400 is configured to supply the bit line sensing signals PBSENSE having different voltages depending on control signals PBSENSE_SW<0:n>. To this end, the bit line sensing signal supply unit 400 includes a reference voltage supply unit 410 configured to buffer a bandgap voltage $V_{BG}$ having a constant level and to output a reference voltage Vref and a voltage divider 420 configured to divide the reference voltage Vref depending on the control signals PBSENSE_SW<0:n>.

The reference voltage supply unit 410 includes an OP amp having a non-inverting terminal (+) to which the bandgap voltage $V_{BG}$ is input. The output terminal of the OP amp is connected to an inverting terminal (−) thereof. The same voltage level as that of the bandgap voltage $V_{BG}$ is output to the output terminal of the OP amp according to the characteristics of the OP amp. That is, the reference voltage Vref has the same level as the bandgap voltage $V_{BG}$.

The voltage divider 420 includes a first resistor Ra and a second resistor Rb, select resistors R0 to Rn, and switching elements N392 to N394. The first resistor Ra and the second resistor Rb are connected in series between the output terminal of the reference voltage supply unit 410 and a ground. The select resistors R0 to Rn are connected in series between the first resistor Ra and the second resistor Rb and are configured to short according to the respective control signals PBSENSE_SW<0:n>, thereby changing divided voltages (i.e., the voltage levels of the bit line sensing signals). The switching elements N392 to N394 are each connected to the terminals (on both ends) of the respective select resistors R0 to Rn and are respectively configured to short the respective select resistors R0 to Rn according to the control signals PBSENSE_SW<0:n>. Accordingly, the number of switching elements equals the number of select resistors. Each of the switching elements may be an NMOS transistor. In more detail, the control signals PBSENSE_SW<0:n> are input to the gates of the respective switching elements N392 to N394, and the drain and source terminals of each of the switching elements N392 to N394 are connected to the terminals (on both sides) of the respective select resistors R0 to Rn.

The bit line sensing signal PBSENSE is output from a node between the first resistor Ra and the second resistors Ro. If all the control signals PBSENSE_SW<0:n> are in a high level and all the switching elements N392 to N394 are turned on, all the select resistors R0 to Rn short. Accordingly, voltage divided by the first resistor Ra and the second resistor Rb is produced as the bit line sensing signal PBSENSE. A process of outputting the bit line sensing signal PBSENSE is described below.

Figure 4:
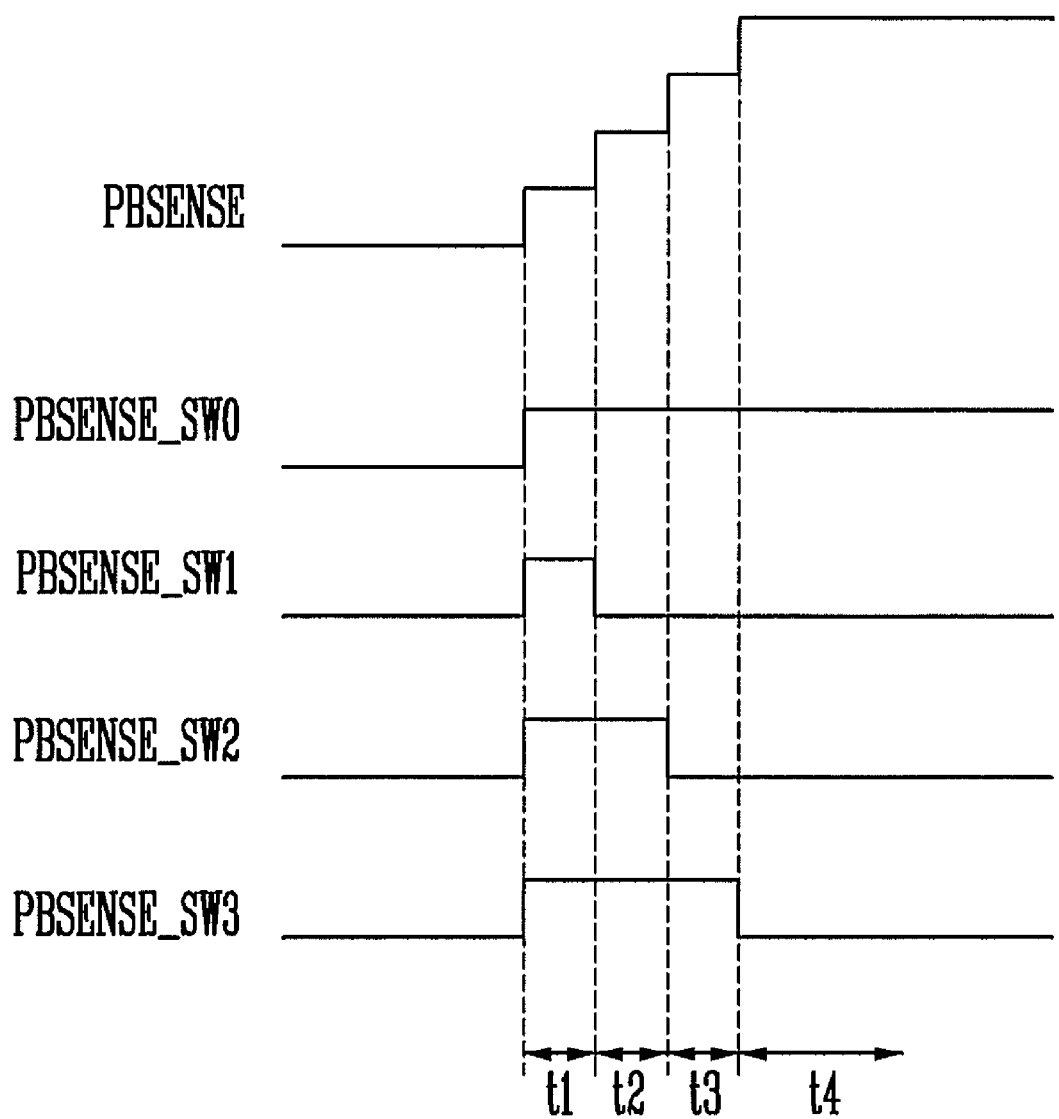
FIG. 4 is a waveform showing the operation of a bit line sensing signal supply unit according to an embodiment.

FIG. 4 is a waveform showing the operation of the bit line sensing signal supply unit according to an embodiment.

The waveform of FIG. 4 is related to the voltage divider of FIG. 3. It is assumed that the voltage divider includes four select resistors R0, R1, R2, and R3 and four switching elements. The first resistor Ra, the second resistor Rb, and each of the select resistors may be set to the same resistance value.

All the control signals PBSENSE_SW<0:n> are input as a high level, so all the switching elements of FIG. 3 are turned on and all the select resistors of FIG. 3 are shorted. Accordingly, the bit line sensing signal PBSENSE has a voltage value which is approximately half the reference voltage Vref.

After a lapse of a certain time t1, the second control signal PBSENSE_SW<1> shifts from the high level to a low level. Accordingly, the switching element to which the second control signal PBSENSE_SW<1> is applied is turned off, and the short state of the second select resistor R1 connected to the corresponding switching element is terminated. Consequently, a voltage divided by the first and second resistors Ra and Rb and the second select resistor R1 is produced as the bit line sensing signal PBSENSE. Accordingly, the bit line sensing signal PBSENSE has a voltage value which is approximately ⅔ of the reference voltage Vref.

Next, after a lapse of a certain time t2, the third control signal PBSENSE_SW<2> shifts from the high level to a low level. A switching element to which the third control signal PBSENSE_SW<2> is applied is turned off, and the short state of the third select resistor R2 connected to the corresponding switching element is terminated. A voltage divided by the first and second resistors Ra and Rb, the second select resistor R1, and the third select resistor R2 is produced as the bit line sensing signal PBSENSE. Accordingly, the bit line sensing signal PBSENSE has a voltage value which is approximately ¾ of the reference voltage Vref.

Next, after a lapse of a certain time t3, the fourth control signal PBSENSE_SW<3> shifts from the high level to a low level. A switching element to which the fourth control signal PBSENSE_SW<3> is applied is turned off, and the short state of the fourth select resistor R3 connected to the corresponding switching element is terminated. A voltage divided by the first and second resistors Ra and Rb, the second select resistor R1, the third select resistor R2, and the fourth select resistor R3 is produced as the bit line sensing signal PBSENSE. Accordingly, the bit line sensing signal PBSENSE has a voltage value which is approximately ⅘ of the reference voltage Vref.

In accordance with the operation of the bit line sensing signal supply unit 400 according to one or more embodiments, the bit line sensing signal PBSENSE which gradually increases can be supplied.

Figure 5:
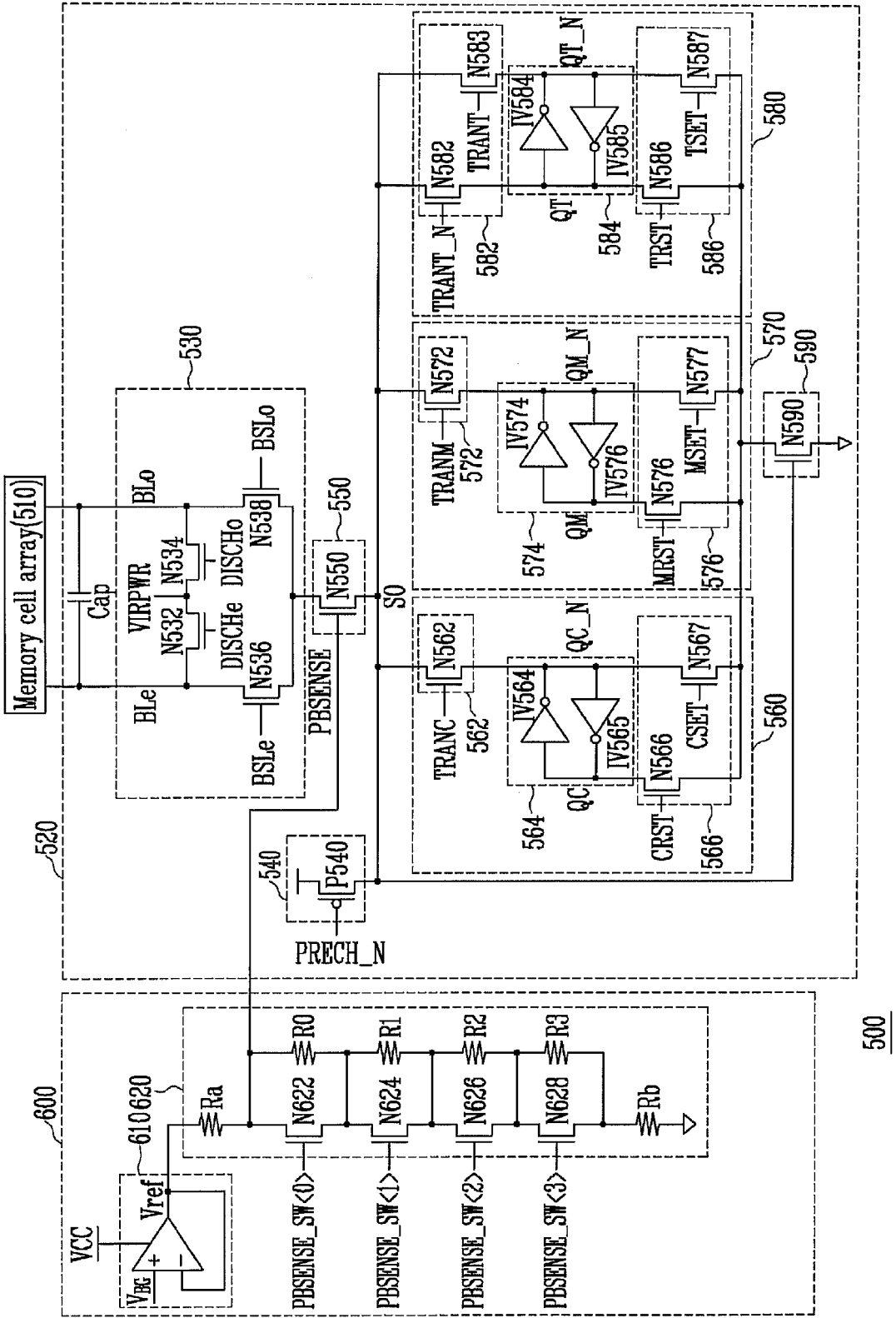
FIG. 5 is a circuit diagram showing the page buffer of a nonvolatile memory device to which the bit line sensing signal supply unit according to an embodiment is applied.

FIG. 5 is a circuit diagram showing the page buffer of a nonvolatile memory device to which the bit line sensing signal supply unit according to an embodiment is applied.

The nonvolatile memory device 500 includes a memory cell array 510 including a number of memory cells and a page buffer 520 connected to the memory cells and configured to program specific data and to read data stored in the memory cells.

The page buffer 520 of the nonvolatile memory device includes a bit line select unit 530, a sensing node precharge unit 540, a bit line sensing unit 550, first to third registers 560, 570, and 580, and a sensing node sensing unit 590. The bit line select unit 530 selectively connects any one of an even bit line and an odd bit line to a sensing node SO. The sensing node precharge unit 540 applies a power supply voltage of a high level to the sensing node SO. The bit line sensing unit 550 transfers the voltage level of a selected bit line to the sensing node SO depending on the state of memory cells during a verification or read operation. The first to third registers 560, 570, and 580 temporarily store data to be programmed into the memory cells or temporarily store data read from the memory cells. The sensing node sensing unit 590 applies a ground voltage to each of the first to third registers 560, 570, and 580 depending on the level of the sensing node SO.

The nonvolatile memory device 500 further includes a bit line sensing signal supply unit 600 configured to output a bit line sensing signal PBSENSE applied to the bit line sensing unit 550.

The page buffer 520 includes the three registers unlike the embodiment of FIG. 3. This is for a 2-bit Multi-Level Cell (MLC) program operation.

The first register 560 includes a first data latch unit 564 configured to temporarily store data, a first data setting unit 566 configured to input data to be stored in the first data latch unit, and a first data transfer unit 562 configured to apply data, stored in the first data latch unit, to the sensing node SO. The second register 570 includes a second data latch unit 574 configured to temporarily store data, a second data setting unit 576 configured to input data to be stored in the second data latch unit, and a second data transfer unit 572 configured to apply data, stored in the second data latch unit, to the sensing node SO. The third register 580 includes a third data latch unit 584 configured to temporarily store data, a third data setting unit 586 configured to input data to be stored in the third data latch unit, and a third data transfer unit 582 configured to apply data, stored in the third data latch unit, to the sensing node SO.

According to a 2-bit MLC program method, distributions each having four different states must be formed. To this end, a program operation and a verification operation are performed by applying state-based data to each of the three registers. For example, if it is sought to maintain cells in an erase state (i.e., a first state), data [1] is stored in the first nodes QC_N, QM_N, and QT_N of the registers. If it is sought to program cells in a state greater than the erase state (i.e., a second state having the second highest threshold voltage), data [100] is stored in the respective nodes (i.e., QC_N:1, QM_N:0, QT_N:0). If it is sought to program cells in a state greater than the second state (i.e., a third state having the third highest threshold voltage), data [001] is stored in the respective nodes (i.e., QC_N:0, QM_N:0, QT_N:1). If it is sought to program cells in a state greater than the third state (i.e., a fourth state having the highest threshold voltage), data [000] is stored in the respective nodes (i.e., QC_N:0, QM_N:0, QT_N:0). As described above, a program operation, a verification operation, etc. are performed by making different data stored in the respective registers every state.

Figure 6:
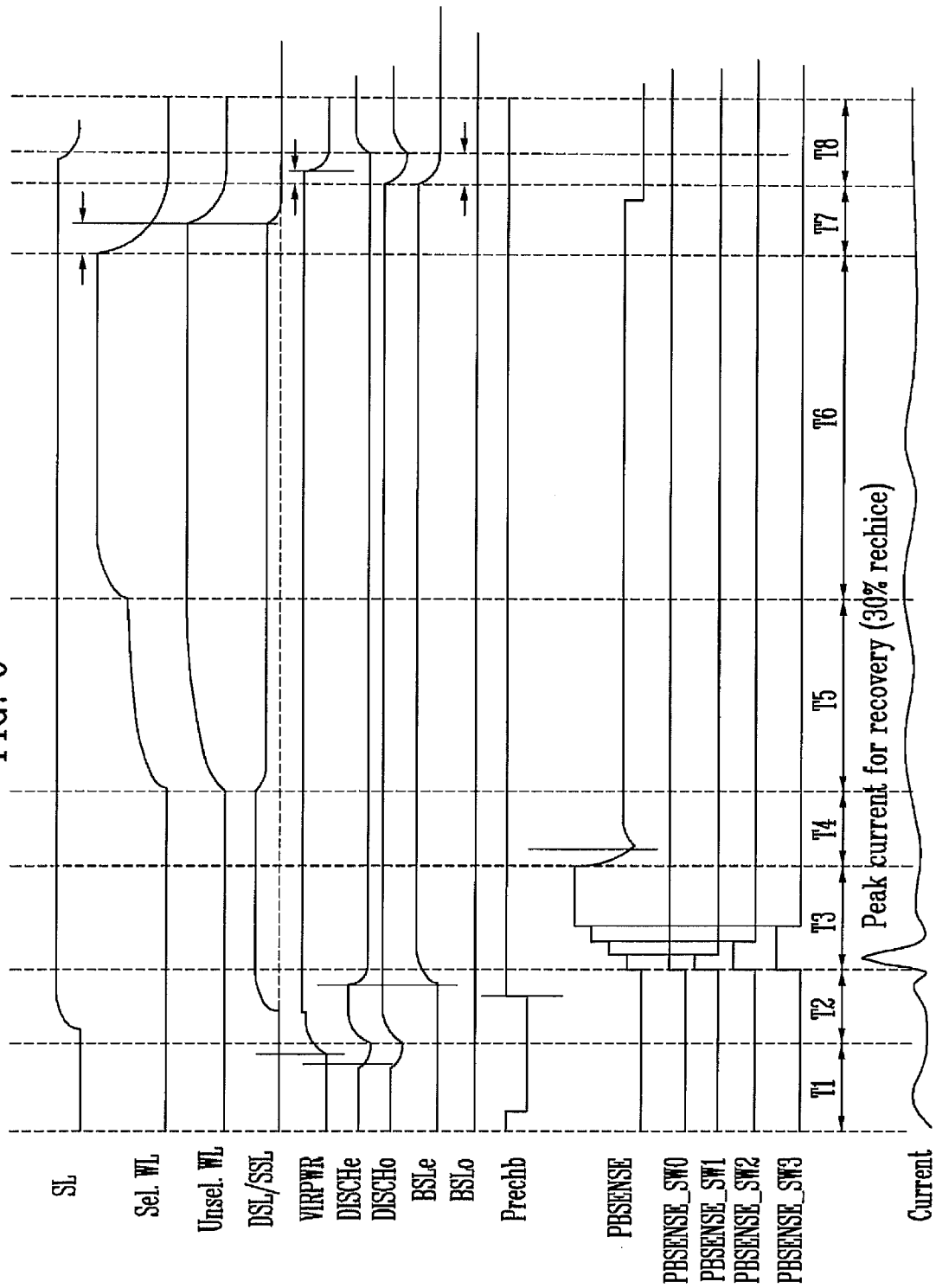
FIG. 6 is a waveform showing a program operation using the nonvolatile memory device to which the bit line sensing signal supply unit according to an embodiment is applied.

FIG. 6 is a waveform showing a program operation using the nonvolatile memory device to which the bit line sensing signal supply unit according to an embodiment is applied.

First, in the state where the ground voltage is being applied to the variable voltage input terminal VIRPWR, the discharge signals DISCHe and DISCHo are applied to the respective bit lines BLe and BLo, thereby discharging the bit lines in a low level (period T1). The sensing node precharge signal Prech b of a low level is applied to the sensing node, thereby precharging the sensing node in a high level.

Next, in the state where a high-level voltage is being applied to the variable voltage input terminal VIRPWR, the discharge signals DISCHe and DISCHo are applied to the respective bit lines, thereby precharging the bit lines to a high level (period T2). The application of the sensing node precharge signal Prech b is stopped. A drain select signal DSL is then applied, so the bit lines are connected to respective memory cell strings. Here, the source select signal SSL is applied as a low level and high-level voltage is applied to the common source line CSL in order to cut off the common source line and the memory cell string.

Next, the bit line select signal BSLe is applied to one of the bit lines, connected to cells to be programmed. The bit line sensing signal PBSENSE of a high level is applied to the bit line sensing unit, so the sensing node is connected to the selected bit line (period T3). Here, the bit line sensing signal PBSENSE which gradually rises is applied to the bit line sensing unit, as shown in FIG. 4. Accordingly, a peak current flowing through the bit line can be reduced by about 30%. According to this operation, target erase data or target program data transferred from each of the latch units to the sensing node is carried in the bit line. Accordingly, the voltage level of the bit line which had been precharged to the high level is changed.

The application of the bit line sensing signal PBSENSE of a high level is stopped (period T4).

A program operation is performed by applying a program voltage to a word line including the cells to be programmed and a pass voltage to the remaining word lines (periods T5 and T6). Accordingly, the threshold voltages of the cells to be programmed may rise because of FN tunneling.

Figure 7:
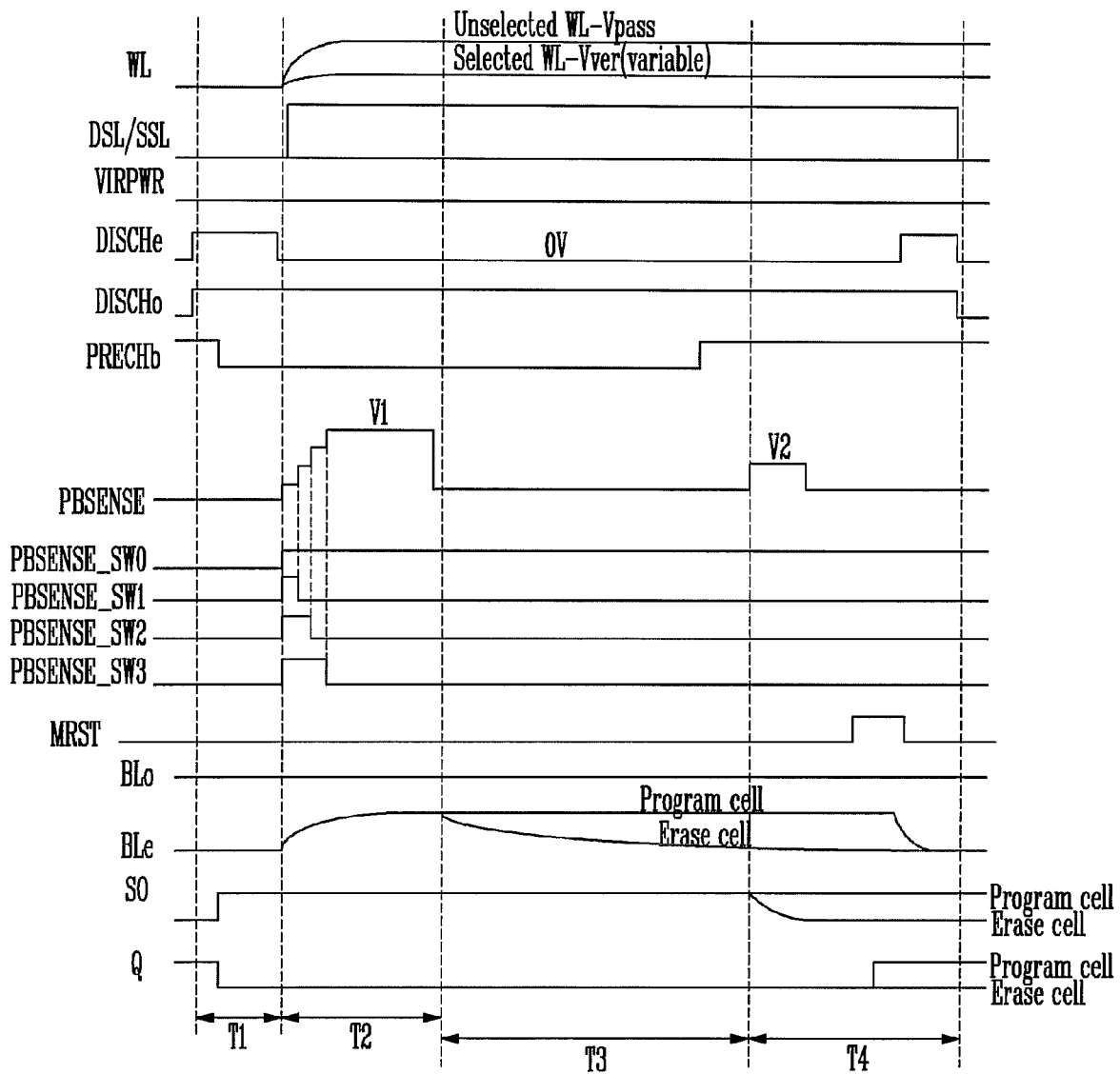
FIG. 7 is a waveform showing a verification operation using the nonvolatile memory device to which the bit line sensing signal supply unit according to an embodiment is applied.

FIG. 7 is a waveform showing a verification operation using the nonvolatile memory device to which the bit line sensing signal supply unit according to an embodiment is applied.

First, the bit lines are discharged, and the first node QM_N of the second data latch unit 574 is reset (period T1).

That is, in the state where the variable voltage VIRPWR of a low level is being applied, the first and second discharge signals DISCHe and DISCho are applied to the respective bit lines BLe and BLo, thereby discharging the bit lines to a low level. Further, in the state where the sensing node SO has shifted to a high level by applying the precharge signal PRECHb of a low level to the sensing node SO, the first data setting signal RESET is applied so that a ground voltage is applied to the first node QM_N. Accordingly, low-level data is stored in the first node QM_N.

The bit lines are precharged to a high level (period T2).

That is, the bit line sensing signal PBSENSE of a first voltage V1 is applied to the bit line sensing unit so that one of the bit lines is connected to the sensing node SO of a high level. Here, the bit line sensing signal PBSENSE which gradually rises is applied to the bit line, as shown in FIG. 4. Accordingly, a peak current flowing through the bit line can be reduced by about 30%. According to this operation, target erase data or target program data transferred from each of the latch units to the sensing node is carried in the bit line. Accordingly, the voltage level of the bit line which had been precharged to the high level is changed.

Here, the bit line select signal BSLe or BSLo of a high level is applied to a specific bit line BLe and BLo to be read so that the bit line is connected to the sensing node SO.

The drain select signal DSL and the source select signal SSL are applied so that the bit line is connected to a memory cell string. Meanwhile, a verification voltage is applied to the word lines of cells to be verified, and a pass voltage Vpass is applied to the word lines of the remaining cells.

The application of the bit line sensing signal PBSENSE is stopped, and the voltage level of the bit line is changed depending on the state of the cells to be verified (period T3). When the threshold voltages of the cells to be verified are higher than the verification voltage, the corresponding cells remain in a turn-off state, so electric charges are not discharged via the memory cell string. Accordingly, the cells maintain a state where the voltage level of the bit line has been precharged. However, when the threshold voltages of the cells to be verified are lower than the verification voltage, the corresponding cells changes to a turn-on state, so electric charges are discharged via the memory cell string. Accordingly, the voltage level of the bit line shifts to a low level.

Next, the bit line sensing signal PBSENSE of a second voltage V2 is applied to the bit line sensing unit so that the voltage state of the bit line is transferred to the sensing node SO (period T4). Data is set in the first node QM_N of the second data latch unit 574 of the page buffer depending on the state of the sensing node SO. To this end, a data setting signal MRST is applied to the second data setting unit 576. In the case where cells to be verified have been programmed to have a verification voltage or a larger voltage, the voltage level of the sensing node maintains a high level. Accordingly, high-level voltage is stored in the first node QM_N in response to the data setting signal MRST. However, in the case where the cells to be verified have not been programmed to have a verification voltage or a larger voltage, the sensing node sensing unit 590 is not driven because the voltage level of the sensing node is low. Accordingly, despite the application of the data setting signal MRST, data initially stored in the first node QM_N remains intact. As described above, even in a verification method, the bit line sensing signal which rises stepwise can be applied.

As described above, the voltage level of the bit line sensing signal applied in order to connect a bit line and the sensing node can be changed smoothly. Accordingly, the amount of a peak current flowing through the bit line due to parasitic capacitance between the bit lines can be reduced.

What is claimed is:

1. A nonvolatile memory device, comprising:
   a bit line sensing signal supply unit configured to output a bit line sensing signal, having a rising voltage level that rises in discrete steps, in response to a control signal; and
   a bit line sensing unit configured to selectively connect a bit line and a sensing node in response to the bit line sensing signal.

2. The nonvolatile memory device of claim 1, wherein the bit line sensing unit comprises an NMOS transistor configured to have a gate to which the bit line sensing signal is input and connected between a bit line select unit and the sensing node.

3. The nonvolatile memory device of claim 1, wherein the bit line sensing signal supply unit comprises:
   a reference voltage supply unit configured to buffer a bandgap voltage having a constant level and to output a reference voltage; and
   a voltage divider configured to divide the reference voltage, wherein a voltage level of the divided voltage is changed depending on each of first to $n^{th}$ control signals, wherein n is a natural number.

4. The nonvolatile memory device of claim 3, wherein the reference voltage supply unit comprises an OP amp having a non-inverting terminal (+) to which the bandgap voltage is input, wherein an output terminal of the OP amp is connected to an inverting terminal (−) of the OP amp.

5. The nonvolatile memory device of claim 3, wherein the voltage divider comprises:
   a first resistor and a second resistor connected in series between an output terminal of the reference voltage supply unit and a ground;
   first to $n^{th}$ select resistors connected in series between the first resistor and the second; and
   first to $n^{th}$ switching elements that are each connected to both terminals of one of the select resistors and are configured to short the respective select resistors in response to the respective control signals.

6. The nonvolatile memory device of claim 5, wherein the first resistor, the second resistor, and the first to $n^{th}$ select resistors have the same resistance value.

7. The nonvolatile memory device of claim 5, wherein:
the voltage divider is configured to output a first divided voltage when the first to $n^{th}$ control signals are applied; and
the divided voltage increases whenever an application of one of the n control signals is stopped.

8. The nonvolatile memory device of claim 5, wherein the voltage divider outputs the bit line sensing signal which raises in discrete steps depending on a control of an application of the first to $n^{th}$ control signals.

9. The nonvolatile memory device of claim 3, wherein the voltage divider is configured to output the bit line sensing signal which rises in discrete steps in response to a control signal.

10. The nonvolatile memory device of claim 1, wherein the sensing node is coupled to a latch for retaining data.

11. A program method using a nonvolatile memory device, comprising:
precharging a sensing node to a high level;
precharging bit lines to a high level; and
connecting the sensing node and one of the bit lines by applying a bit line sensing signal, having a rising voltage level that rises in discrete steps, to a switching element configured to selectively connect the sensing node and the bit line.

12. The method of claim 11, further comprising applying a program voltage to a selected word line and applying a pass voltage to the remaining word lines.

13. The method of claim 11, further comprising:
when data applied to the sensing node is target program data, shifting a voltage level of the bit line to a low level; and
when the data applied to the sensing node is target erase data, maintaining the voltage level of the bit line in a high level.

14. A read method using a nonvolatile memory device, comprising:
precharging a sensing node to a high level;
connecting a bit line and the sensing node by applying a bit line sensing signal of a first voltage to a switching element configured to selectively connect the sensing node and the bit line, wherein a voltage level of the bit line sensing signal rises in discrete steps and reaches the first voltage;
stopping the application of the bit line sensing signal and changing a voltage level of the bit line depending on a state of cells to be verified; and
applying the bit line sensing signal of a second voltage so that a voltage state of the bit line is transferred to the sensing node.

15. The read method of claim 14, wherein the rising voltage level of the bit line sensing signal is produced by using a series of resistors that are each selectively shorted by a respective switch coupled across the resistor and by increasing a number of the switches that are turned off gradually.

16. The read method of claim 15, wherein the series of resistors are connected to another resistor that receives a reference voltage and does not have a switch connected across terminals of said another resistor.

* * * * *